US012593525B2

(12) United States Patent
Clarke et al.

(10) Patent No.: US 12,593,525 B2
(45) Date of Patent: Mar. 31, 2026

(54) OFFSET VERTICAL INTERCONNECT AND COMPRESSION POST FOR 3D-INTEGRATED ELECTRICAL DEVICE

(71) Applicant: Raytheon Company, Waltham, MA (US)

(72) Inventors: Andrew Clarke, Santa Barbara, CA (US); James Pattison, Goleta, CA (US); Stuart Farrell, Goleta, CA (US)

(73) Assignee: Raytheon Company, Arlington, VA (US)

( * ) Notice: Subject to any disclaimer, the term of this patent is extended or adjusted under 35 U.S.C. 154(b) by 769 days.

(21) Appl. No.: 17/686,692

(22) Filed: Mar. 4, 2022

(65) Prior Publication Data

US 2022/0293661 A1 Sep. 15, 2022

Related U.S. Application Data

(60) Provisional application No. 63/159,749, filed on Mar. 11, 2021.

(51) Int. Cl.
*H10F 39/00* (2025.01)

(52) U.S. Cl.
CPC ......... *H10F 39/811* (2025.01); *H10F 39/018* (2025.01); *H10F 39/809* (2025.01)

(58) Field of Classification Search
CPC ......... H01L 27/14636; H01L 27/14634; H01L 27/1469; H01L 2224/0239;
(Continued)

(56) References Cited

U.S. PATENT DOCUMENTS

| | | | | |
|---|---|---|---|---|
| 11,869,761 | B2 * | 1/2024 | Cheng | H01L 27/14683 |
| 2014/0256092 | A1 * | 9/2014 | Kuo | H01L 21/566 |
| | | | | 438/124 |

(Continued)

FOREIGN PATENT DOCUMENTS

| | | |
|---|---|---|
| JP | H04-318979 A | 11/1992 |
| JP | 2011-054805 A | 3/2011 |

(Continued)

OTHER PUBLICATIONS

International Search Report and Written Opinion mailed Jun. 20, 2022 in corresponding International Application No. PCT/US2022/019082.

(Continued)

*Primary Examiner* — Jeff W Natalini
*Assistant Examiner* — Rose Keagy

(57) ABSTRACT

An electrical device including a substrate, a dielectric layer supported by the substrate having at least one vertical post disposed within a via hole of the dielectric layer, and at least one electrically conductive vertical interconnect laterally offset from the post. The post is configured to impart a non-tensile state to a region of the electrical device underlying the post. The coefficient of thermal expansion (CTE) of the post may be configured to cooperate with the CTE of the dielectric layer to provide the non-tensile state, such as the dielectric layer having a CTE that is equal to or greater than a CTE of the post. The dielectric layer may have a CTE that is less than the CTE of the electrically conductive vertical interconnect, and may be arranged to provide a buffer to tensile forces imparted by the vertical interconnect.

20 Claims, 14 Drawing Sheets

(58) Field of Classification Search

CPC . H01L 2224/05008; H01L 2224/05144; H01L
2224/05186; H01L 2224/05569; H01L
2224/05609; H01L 2224/05647; H01L
2224/05655; H01L 2224/08145; H01L
2224/8034; H01L 2224/80379; H01L
2224/94; H01L 2924/351; H01L 25/0657;
H01L 25/50; H01L 24/02; H01L 24/05;
H01L 24/08; H01L 24/80; H01L
2224/023; H01L 2224/0231; H01L
2224/0235; H01L 2224/0236; H01L
31/02002; H01L 31/0203; H01L
31/02966; H01L 31/09; H01L
2924/00014; H01L 2924/04941; H01L
2224/80001; H01L 2924/05442; H01L
2924/01079; H01L 23/49838; H01L
23/5226; H01L 2224/02–09519; H01L
2224/03–0392; H01L 2224/05–09519

See application file for complete search history.

(56) References Cited

U.S. PATENT DOCUMENTS

| | | | | |
|---|---|---|---|---|
| 2015/0061062 | A1* | 3/2015 | Lin | H01L 27/14623 438/69 |
| 2015/0228555 | A1 | 8/2015 | Rabie et al. | |
| 2017/0084773 | A1* | 3/2017 | Piccione | H01L 31/1075 |
| 2021/0183935 | A1* | 6/2021 | Chen | H01L 27/14629 |
| 2022/0285298 | A1* | 9/2022 | Clarke | H01L 25/167 |

FOREIGN PATENT DOCUMENTS

| | | |
|---|---|---|
| JP | 2011-114226 A | 6/2011 |
| JP | 2016048720 | 4/2016 |
| KR | 10-2004-0089496 A | 10/2004 |
| KR | 10-2017-0089026 A | 8/2017 |
| KR | 10-2020-0036696 A | 4/2020 |

OTHER PUBLICATIONS

Notice of Reasons for Refusal dated Sep. 17, 2024 in connection with Japanese Patent Application No. 2023-554791, 6 pages.
Request for the Submission of an Opinion dated Aug. 2, 2024 in connection with Korean Patent Application No. 10-2023-7023816, 11 pages.
Written Decision on Registration dated Mar. 13, 2025 in connection with Korean Patent Application No. 10-2023-7023816, 5 pages.
Communication pursuant to Article 94(3) EPC dated Feb. 26, 2025 in connection with European Patent Application No. 22716600.6, 7 pages.

* cited by examiner

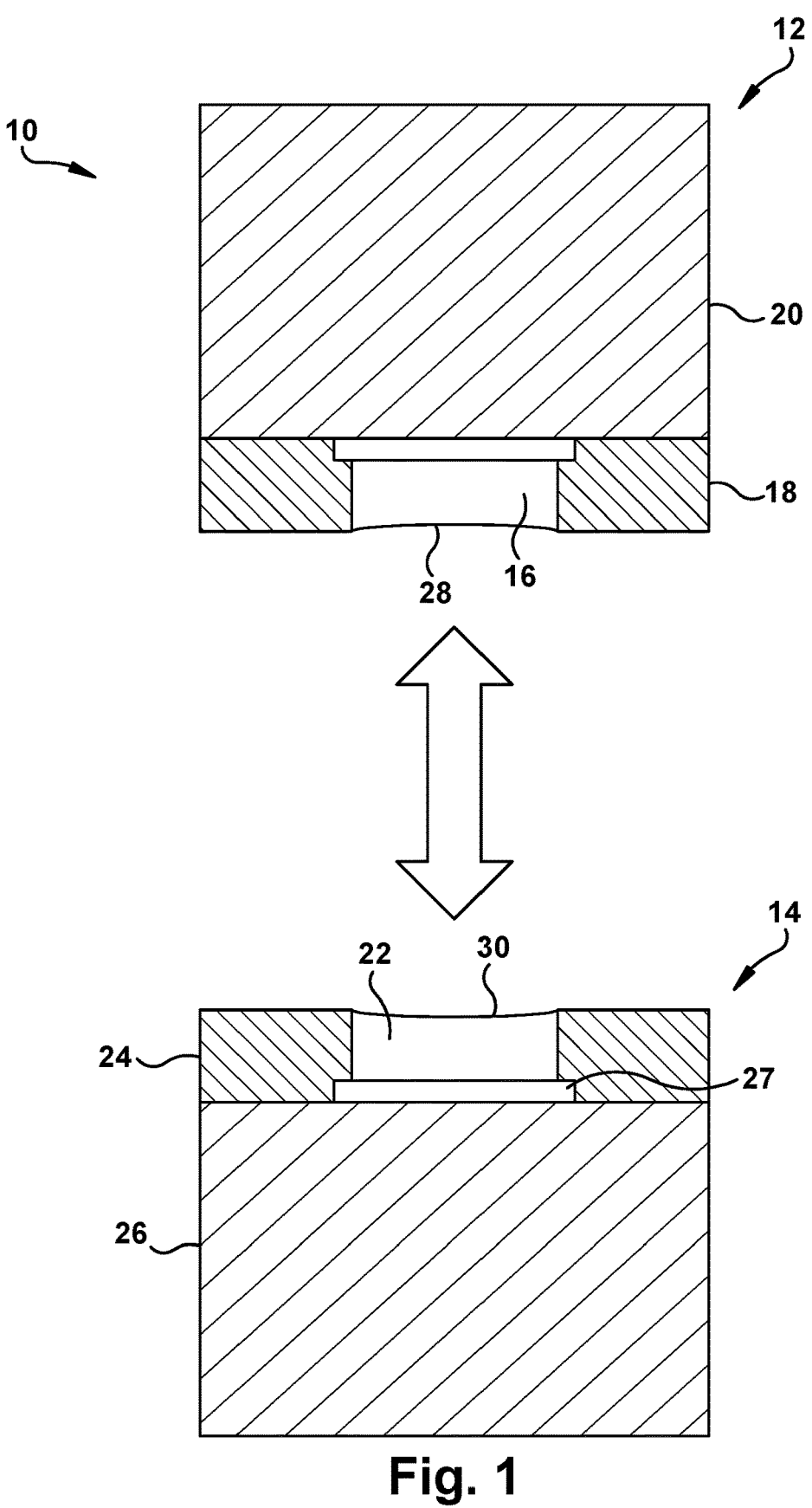
Fig. 1
(Conventional)

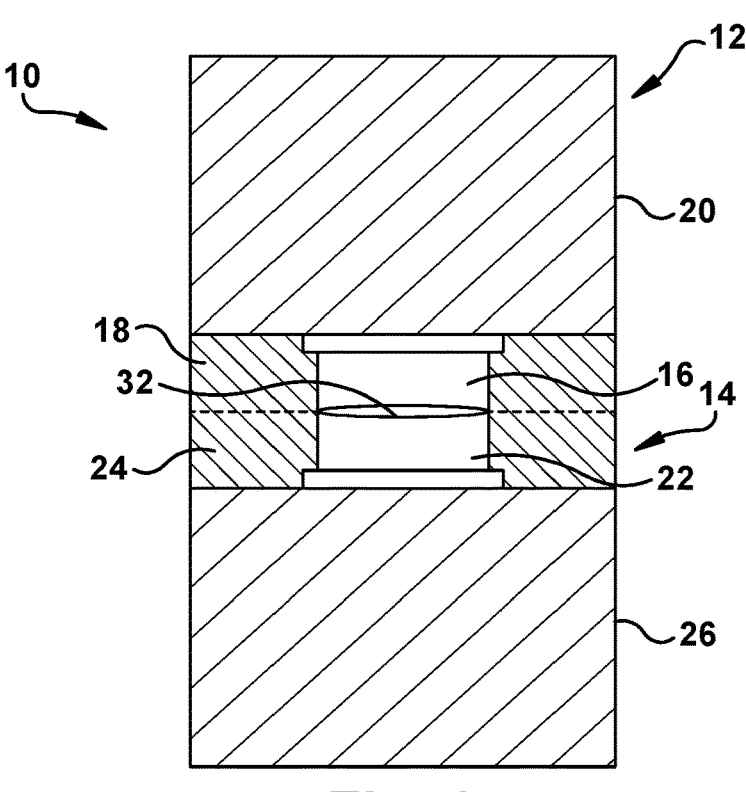
Fig. 2
(Conventional)
Fig. 3
(Conventional)

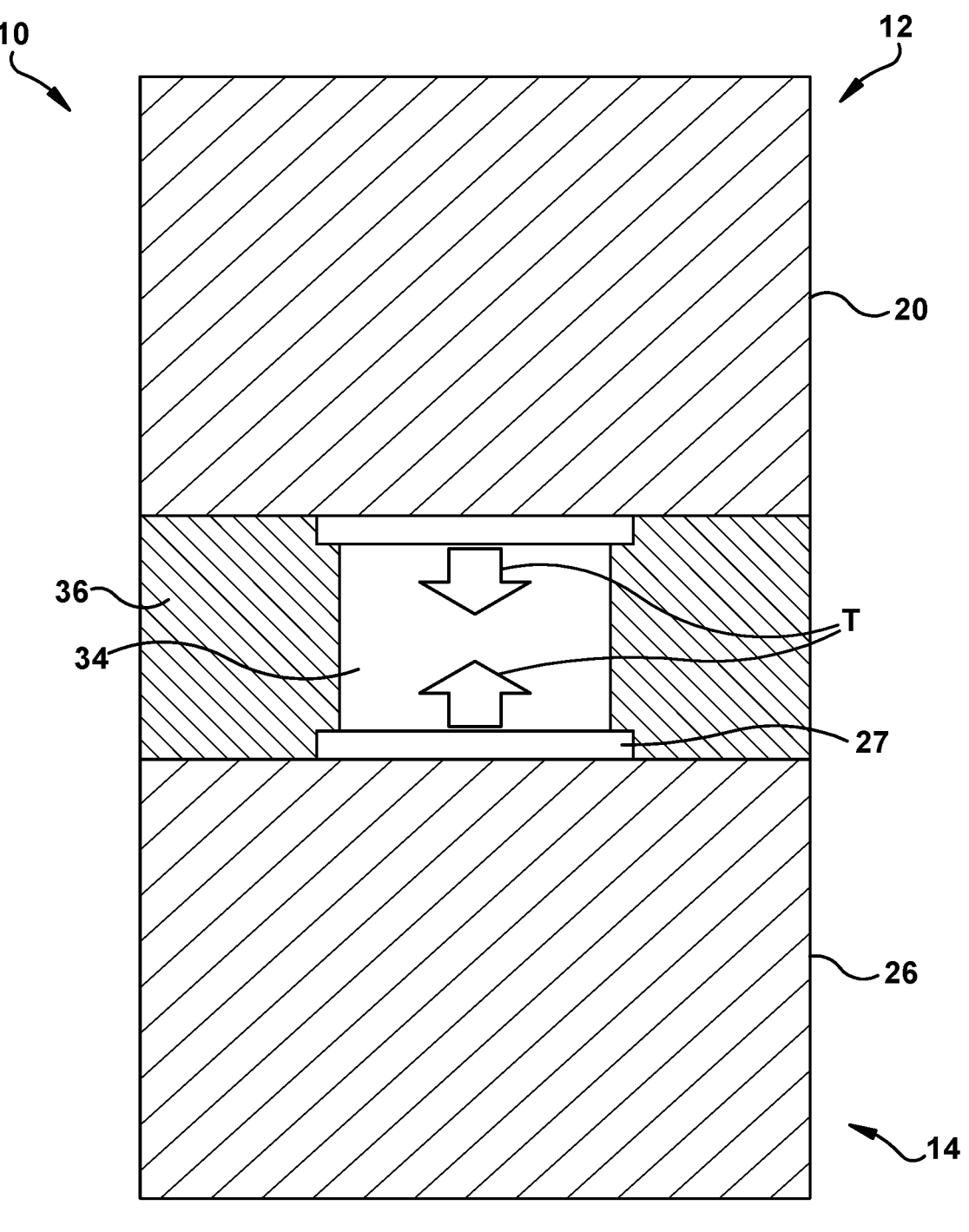
FIG. 4
(CONVENTIONAL)

112

134
128
130

118

112

160

134
128
130

118

1

OFFSET VERTICAL INTERCONNECT AND COMPRESSION POST FOR 3D-INTEGRATED ELECTRICAL DEVICE

RELATED APPLICATIONS

This application claims the benefit of U.S. Provisional Application No. 63/159,749 filed Mar. 11, 2021, which is hereby incorporated herein by reference in its entirety.

TECHNICAL FIELD

The present disclosure relates generally to electrical devices having electrical interconnect structures, and more particularly to an electrical device with a vertical interconnect offset from a compression post, particularly for three-dimensionally integrated electrical devices, such as planar infrared (IR) detectors that operate at low temperatures.

BACKGROUND

Electrical devices, such as semiconductor integrated circuits (ICs) or other semiconductor devices, are typically fabricated into and/or on a substrate, such as a silicon wafer, resulting in an IC area that generally increases in size and density as the complexity of the IC increases. One trend in recent IC fabrication has been to increase the number and/or different types of ICs by vertically stacking and vertically interconnecting the ICs together. Generally, each of the vertically stacked ICs can be of different sizes, come from different size wafers, have different functions, be made of different materials, etc.

Some conventional methods for realizing the approach of vertically stacking and integrating ICs is through a direct bond or hybrid bond process. Commonly, after a desired number of individual ICs have been vertically stacked, the stacked electrical device assembly undergoes a temperature treatment to cause diffusion between structure(s) of the opposing ICs resulting in a 3D-integrated electrical device structure with an electrical connection across the stacked ICs.

SUMMARY

Some vertically integrated electrical devices of the type described above are intended to operate in a temperature regime that is far from standard ambient temperature (i.e., 25° C. according to IUPAC standards). For example, some types of infrared detectors may operate at a temperature of about −200° C. This has been found to cause interrupted electrical communication between interconnect structures in the electrical device due to coefficient of thermal expansion (CTE) mismatches between different structures in the device. In addition, some electrical devices may incorporate fragile materials into their architecture, for example materials with low fracture toughness, in which tensile forces imparted on the fragile material will cause damage and/or interrupt proper operation of the material.

An aspect according to the present disclosure provides a vertical interconnect design that reduces or eliminates damage and/or electrical interruption due to tensile strain from thermal expansion and contraction during fabrication or operation of the electrical device, particularly for 3D-integrated devices formed by wafer bonding techniques.

According to an aspect, the electrical device provides such a design by laterally offsetting the electrically conductive vertical interconnect structure from a via post that puts a region underlying the post into a non-tensile state, such as in a neutral state or compressive state rather than in tension.

The post may be configured to cooperate with a buffer layer that forms the via hole and at least partially surrounds the post, such that upon expansion or contraction during fabrication or operation, the post imparts the non-tensile forces to the underlying region below the post.

To enable such design, the buffer layer may have a coefficient of thermal expansion (CTE) that is equal to or greater than that of the post across the range of temperatures the device experiences, from fabrication to operation.

The buffer layer also may provide a buffer to tensile forces imparted by the laterally offset vertical interconnect.

The region underlying the post may include an electrical contact pad, and to enable electrical connection between the contact pad and the laterally offset vertical interconnect, an electrically conductive connection layer may extend laterally between the vertical interconnect and contact pad underlying the post.

In particular applications, the 3D-integrated electrical device may include a photodetector bonded to a read out integrated circuit (ROIC). The photodetector may be an IR sensor, for example, in which mercury cadmium telluride ($Hg_{1-x}Cd_xTe$) (also referred to as "MCT") is employed as the photoconductive material. MCT is an example of a fragile material that is susceptible to damage (e.g., defects, crack propagation, and/or interface failure) and/or electrical interruption (e.g., piezoelectric response) when experiencing a relatively small amount of tensile strain. For example, the $K_{IC}$ fracture toughness of MCT may be about 0.20 MPa·m$^{1/2}$ by micro-indentation testing.

The bonding of electrical connections between wafers containing MCT wafers containing ROICs generally involves a robust conductive interconnect structure passing through the dielectric insulating layers, which may be about 4 μm thick in total for an individual electrical device. However, conventional methods used to form interconnects in such 3D-integrated detectors have been found to falter or fail when cooled to below ambient room temperature, and more particularly when cooled to a very low operating temperature of the device of 76K (−197° C.). This is believed to be due to CTE mismatches in the conventional design, in which the conventional metal interconnect post contracts more than the surrounding dielectric layer, imparting high tensile stress on the contact pads and the MCT layer.

According to an aspect of the present disclosure, to enable a successful electrical structure during fabrication and operation, it is desirable to construct the electrical interconnect in a way that minimizes tensile strain on the fragile MCT material across a temperature range that includes fabrication and operation, about 70K to 433K, for example.

More particularly, according to an aspect, an interconnect and corresponding post structure is described herein that overcomes at least the foregoing problem with conventional designs by providing an electrical device that assures good electrical contact between a ROIC and an MCT-based detector through layers of dielectrics and bonding oxides, without causing tensile strain between the fragile MCT semiconductor contacts and their contact metal interface. Such a design can be extended to other II-VI materials in general, since they also are quite fragile.

According to an aspect, an electrical device includes: a substrate; a dielectric layer supported by the substrate, wherein the dielectric layer has at least one via hole and a vertical post within the at least one via hole; and at least one electrically conductive vertical interconnect laterally offset from the post; wherein the post is configured to impart a non-tensile state to a region of the electrical device underlying the post.

According to an embodiment of any paragraph(s) of this summary, the dielectric layer has a coefficient of thermal expansion that is different than a coefficient of thermal expansion of the post, the dielectric layer at least partially surrounding the post and being configured to interact with the post to impart the non-tensile state to the region underlying the post.

According to an embodiment of any paragraph(s) of this summary, the dielectric layer has a coefficient of thermal expansion that is equal to or greater than the coefficient of thermal expansion of the post.

According to an embodiment of any paragraph(s) of this summary, the dielectric layer has a coefficient of thermal expansion that is less than or equal to a coefficient of thermal expansion of the vertical interconnect.

According to an embodiment of any paragraph(s) of this summary, the vertical interconnect overlies the dielectric layer and is vertically offset from the post.

According to an embodiment of any paragraph(s) of this summary, further including a bonding layer, wherein the vertical interconnect is disposed within a via hole of the bonding layer, the bonding layer overlying at least a portion of the dielectric layer, and wherein the bonding layer is disposed within the via hole of the dielectric layer to form the post.

According to an embodiment of any paragraph(s) of this summary, the dielectric layer includes a first dielectric layer portion and a second dielectric layer portion at least partially overlying the first dielectric layer portion, and a bonding layer at least partially overlies the second dielectric layer portion, wherein the first dielectric layer portion is deposited to provide a neutral stress, the second dielectric layer portion is deposited to provide a tensile stress, and the bonding layer is deposited to provide a compressive stress.

According to an embodiment of any paragraph(s) of this summary, the first dielectric layer portion is AlN, wherein the second dielectric layer portion is AlN, and wherein the bonding layer is $SiO_x$.

According to an embodiment of any paragraph(s) of this summary, the region of the electrical device underlying the post includes a fragile material that forms at least part of the substrate, the fragile material having a Kc fracture toughness of less than 1 MPa·m$^{1/2}$.

According to an embodiment of any paragraph(s) of this summary, the fragile material comprises mercury cadmium telluride.

According to an embodiment of any paragraph(s) of this summary, further including an electrical contact pad between the post and the fragile material.

According to an embodiment of any paragraph(s) of this summary, further including an electrical contact pad underlying the post, and an electrical connector extending from the electrical contact pad to the vertical interconnect to provide electrical communication therebetween.

According to an embodiment of any paragraph(s) of this summary, the electrical connector includes a conductive layer that overlies a portion of the dielectric layer and extends up a sidewall of the via hole in the dielectric layer.

According to an embodiment of any paragraph(s) of this summary, the post imparts a neutral state or a compressive state to the region underlying the post when the electrical device is in an operating state.

According to an aspect, a 3D-integrated electrical device includes a first electrical device bonded and electrically integrated to a second electrical device, the 3D-integrated electrical device comprising: a bonding layer; first and second dielectric layers on opposite sides of respective portions of the bonding layer; first and second via holes in respective portions of the first and second dielectric layers, the first and second via holes being arranged opposite to each other, and wherein the bonding layer is disposed within the first and second via holes to form respective first and second post portions of the 3D-integrated electrical device; an electrically conductive vertical interconnect extending through the bonding layer, the vertical interconnect being laterally offset from the first and second post portions; a contact pad underlying at least a portion of the first post portion; and a conductor layer overlying at least a portion of the first dielectric layer to electrically connect the contact pad with a first end portion of the vertical interconnect.

According to an embodiment of any paragraph(s) of this summary, the first and second dielectric layers each has a coefficient of thermal expansion that is equal to or greater than a coefficient of thermal expansion of the first and second post portions; wherein the vertical interconnect has a coefficient of thermal expansion that is greater than the first and second dielectric layers and greater than the bonding layer; wherein at least the first post portion is configured to impart a non-tensile state to a region underlying the contact pad; and wherein at least the first dielectric layer underlies the first end portion of the vertical interconnect to provide a buffer to tensile stress imparted under the first end portion of the vertical interconnect.

According to an embodiment of any paragraph(s) of this summary, the dielectric layer includes a first dielectric layer portion and a second dielectric layer portion at least partially overlying the first dielectric layer portion, the bonding layer at least partially overlying the second dielectric layer portion, wherein the first dielectric layer portion is deposited to provide a neutral stress, the second dielectric layer portion is deposited to provide a tensile stress, and the bonding layer is deposited to provide a compressive stress.

According to an embodiment of any paragraph(s) of this summary, the first dielectric layer portion is AlN, wherein the second dielectric layer portion is AlN, wherein the bonding layer is $SiO_x$, wherein the post is $SiO_x$, wherein the vertical interconnect is copper, and wherein the region of the electrical device underlying the first post portion includes mercury cadmium telluride.

According to an embodiment of any paragraph(s) of this summary, the first electrical device is a photodetector, and the second electrical device is a read out integrated circuit.

According to an aspect, an electrical device includes: providing a substrate; forming a dielectric layer overlying at least a portion of the substrate; forming a via hole in the dielectric layer; forming a post in the via hole; and forming an electrically conductive vertical interconnect laterally offset from the post; wherein the post is configured to impart a non-tensile state to a region of the electrical device underlying the post.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects according to the present disclosure.

FIG. 1 is a schematic illustration of first and second conventional electrical devices prepared for 3D-integration.

FIG. 2 is a schematic illustration of a state of initial contact between the first and second conventional electrical devices in FIG. 1 at standard ambient temperature.

FIG. 3 is a schematic illustration of a state of elevated temperature bonding and 3D-integration between the first and second conventional electrical devices in FIG. 1.

FIG. 4 is a schematic illustration of the conventional 3D-integrated device in FIG. 3 when cooled to standard ambient temperature, or lower, following the elevated temperature bonding.

DETAILED DESCRIPTION

Figure 5A:
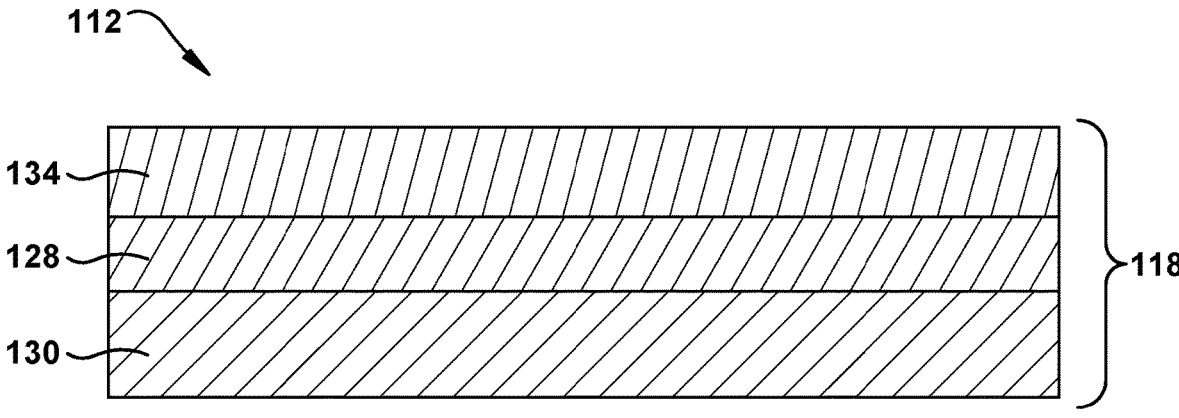
FIGS. 5A-5R are schematic cross-sectional illustrations depicting exemplary process steps of forming an exemplary electrical device according to an embodiment.

The principles and aspects according to the present disclosure have particular application to electrical devices, such as integrated circuit (IC) devices, and more particularly vertically integrated semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide an aluminum nitride tensile layer for balancing forces and thereby controlling the amount of bow in such devices. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to vertically integrating both active and passive electrical devices.

Referring to FIGS. 1-4, a schematic illustration of a conventional 3D-integrated device 10 including a read out integrated circuit (ROIC) 12 and photodetector 14 are shown. In the illustration, the ROIC 12 includes a metal vertical interconnect 16 in a via hole extending through a bonding layer 18 that is supported by a substrate 20. Also shown in the illustration, the conventional photodetector 14 includes at a corresponding metal vertical interconnect 22 extending through a via hole extending through a bonding layer 24 that is supported by a substrate 26. The substrate 26 of the photodetector 14 may include mercury cadmium telluride ($Hg_{1-x}Cd_xTe$) (also referred to as "MCT") as the photoconductive material of the sensor. A metal contact pad 27 overlies the MCT layer (also referred to with reference numeral 26 in this illustration) for providing an electrical connection between the MCT material and metal interconnect 22.

As shown in FIG. 1, the interconnect 16 of the ROIC 12 and the interconnect 22 of the photodetector 14 may each have a respective dished profile 28, 30 by virtue of chemical mechanical polishing (CMP) during processing of each device 12, 14. FIG. 2 shows the photodetector 14 and ROIC 12 being contacted and bonded together at the respective interfaces of the bonding layers 18, 24. As shown, because of the dished profiles 28, 30, a gap 32 exists between the interfaces of the respective interconnects 16, 22.

FIG. 3 illustrates a state of annealing the electrical device assembly at an elevated temperature. As shown, during the elevated temperature anneal, the metal interconnects 16, 22 expand more than their surrounding bonding layers 18, 24, closing the gap 32 therebetween and making compressive contact in which the interconnects 16, 22 undergo diffusion across their interface and fuse together into a single integrated conductive post 34 extending through an integrated bonding layer 36.

FIG. 4 illustrates the effect of cooling to standard ambient temperature, or below, following the elevated temperature anneal shown in FIG. 3. As shown in FIG. 4, the integrated metal interconnect structure 34 will contract more than its surrounding integrated bonding layer 36, resulting in tensile stress (depicted with arrows T). This tensile stress increases significantly as the temperature is cooled to a very low operating temperature of the device, which may be around 76K (−197° C.). It has been found that CTE mismatches between the metal interconnect structure(s) 34 and surrounding insulating bonding layer(s) 36 can cause the 3D-integrated device 10 to reduce in performance or fail when cooled to ambient room temperature, and more particularly when cooled to the operating temperature of the device (e.g., 76K). More specifically, the effect of this tensile stress is to generate strain on the semiconductor contact surface. The performance of the electrical device 10 may be negatively impacted by tensile strain, especially when the tensile strains are imparted upon a fragile material, such as MCT. For example, the tensile strains imparted on the MCT material may impact performance by inducing a piezoelectric response. Alternatively or additionally, the tensile strains may cause damage to the MCT material in the form of defects, crack propagation, and/or interface failure with the metal contact pad 27. The effect of these tensile strains may become more pronounced when the difference between the CTE of the interconnect material and surrounding insulating (e.g., bonding layer) is greater.

As a comparative example of a conventional design, interconnect structures 34 made of copper will fuse to form a single integrated vertical interconnect structure (also 34) at 150° C. If bonding between the bonding layers 36 has not separated, this is the starting volume and length to consider. As the part cools from 150° C., the bonding layers 36 will contract less than the Cu interconnect structure 34, so the interconnect experiences high tensile stress. When the tensile stress on the Cu interconnect 34 reaches its yield strength, plastic deformation will begin. The tensile stress required to initiate plastic deformation in Cu is about 300 MPa at ambient room temperature (25° C.), and about 322 MPa at 76K. The values of relative contraction of the Cu interconnect 34 as a function of temperature can be calculated based on its CTE and length; for example Cu at 60K contracts by about −316 Å/μm. A 4 μm-thick Cu interconnect 34 will contract by about −2100 Å/μm over a temperature range from 423K down to 76K, which may be about 4.5% or more greater contraction than the surrounding bonding layer 36 over the same temperature range. If the Cu interconnect 34 can break away from the sidewalls of the bonding layer 36 and plastically elongate, the residual tensile stress (yield strength) at 76K is about 330 MPa. This level of tensile stress imparted to an MCT region below the interconnect would exceed the fracture toughness of MCT (about 0.20 MPa·m$^{1/2}$ K$_{IC}$).

An exemplary electrical device is described herein that improves upon one or more deficiencies of conventional design(s). In particular, one aspect provides an electrical device including a substrate, a dielectric layer supported by the substrate having at least one vertical post disposed (comprised of a low-CTE dielectric) within a via hole of the dielectric layer, and at least one electrically conductive vertical interconnect laterally offset from the post, wherein the dielectric post is configured to impart a non-tensile state to a region of the electrical device underlying the post. According to an aspect, the dielectric layer provides a CTE that is equal to or greater than a CTE of the dielectric post to thereby impart the non-tensile state (e.g., neutral or compressive forces) at the region underlying the post. The dielectric layer may have a CTE that is less than the CTE of the electrically conductive vertical interconnect structure, and may be arranged to provide a buffer to tensile forces imparted by the vertical interconnect structure. An aspect also provides method(s) of fabricating such device(s) according to the above.

Figure 7:
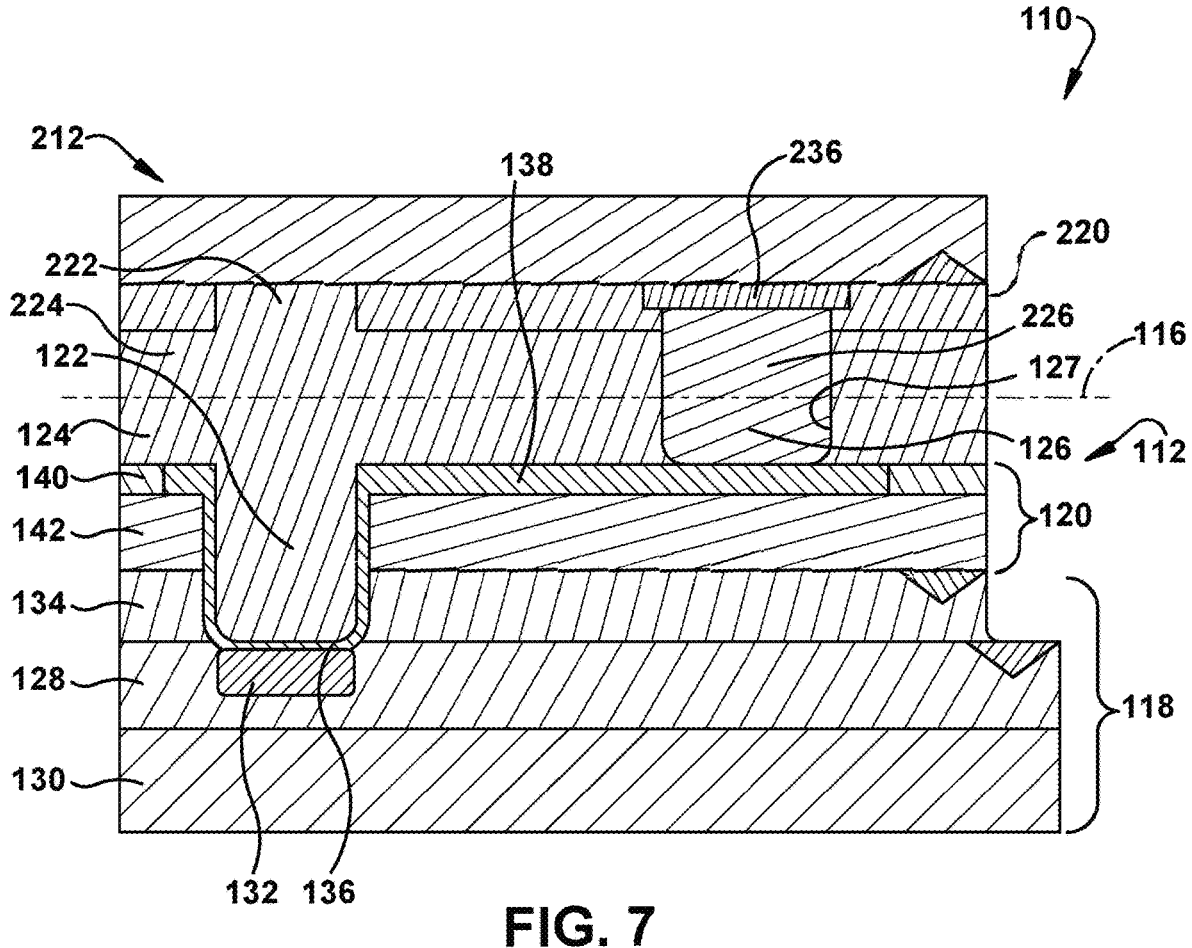
FIG. 7 is a schematic cross-sectional illustration of an exemplary 3D-integrated device according to an embodiment of the present disclosure.

Turning initially to FIG. 7, an exemplary 3D-integrated electrical device 110 according to an embodiment of the present disclosure is shown. The exemplary state shown in FIG. 7 may be a low-temperature operating state of the device, such as about 76 K. As shown, the exemplary 3D-integrated device 110 includes an exemplary first electrical device 112 bonded and electrically integrated to an exemplary second electrical device 212. The delineation between the first and second electrical devices is shown with broken line 116; although it is understood that following bonding and 3D-integration (described below), the two electrical devices 112, 212 form the single 3D-integrated electrical device 110.

The first electrical device 112 includes a substrate 118, an electrically insulating dielectric layer 120 supported by the substrate 118, at least one vertical post 122 disposed within a via hole 123 of the dielectric layer 120, a bonding layer 124, and at least one electrically conductive interconnect 126 laterally offset from the post 122 and extending through the bonding layer 124. In exemplary embodiments, the first electrical device 112 is a semiconductor device in the form of a photodetector (also referred to with 112). In the illustrated embodiment, the photodetector 112 is an IR detector. The first electrical device 112 may represent one pixel of a photodetector array. The second electrical device 212 in the illustrated embodiment is a read out integrated circuit (ROIC), which may include some of the same or similar structures as the photodetector 112, as described in further detail below.

In the illustrated embodiment, the substrate 118 supporting the dielectric layer 120, post 122, interconnect 126 and bonding layer 124 includes a layer of photoconductor material 128, which may at least partially overlie and be supported by a lower substrate layer 130. In exemplary embodiments, the photoconductor material 128 is mercury cadmium telluride (Hg$_{1-x}$Cd$_x$Te) (also referred to as "MCT"), which forms a photoconductive layer (also 128) overlying the lower substrate layer 130. The lower substrate layer 130 may be any suitable substrate configured to support the other layers, such as a silicon substrate, for example. In the photodetector 112, an incident IR photon may pass through the lower substrate layer 130 and interact with the MCT photoconductive layer 128 to generate a photoelectric current. To provide a photoelectric effect, the photoconductive layer 128 may include an implant 132 oppositely doped to that of the photoconductive material 128. For example, the MCT photoconductive material 128 may be an n-type semiconductor, and the implant 132 may be a p-type implant such as arsenic.

The layers below the dielectric layer 120, which in combination are generally referred to herein simply as the substrate 118, may include additional layers depending on the type of electrical device and fabrication method. For example, between the MCT photoconductive layer 128 and lower substrate layer 130, one or more buffer layers may be provided which may include cadmium and tellurium, and which may improve epitaxial growth of the MCT photoconductive layer 128 above. In addition, one or more passivation layers 134 may be formed atop the photoconductive layer 128, which may include cadmium and tellurium, and which may improve the interfacial bonding between the MCT photoconductive layer 128 and adjacent dielectric layer 120.

Between the MCT photoconductive layer 128 and the post 122 is an electrical contact pad 136 for transferring electricity generated in the MCT photoconductive layer 128 to the interconnect 126. Generally, the electrical contact pad 136 is disposed above the implant 132 in the MCT photoconductive layer 128 to transfer the electrons generated at the p-n junction due to the photoelectric effect. The contact pad 136 may be formed with any suitable electrically conductive material, including an electrically conductive metal. In exemplary embodiments, the contact pad 136 may include a metal layer (e.g., gold) and a barrier layer (e.g., TiN) overlying the metal layer to enhance rigidity and/or prevent interdiffusion.

Because the vertical interconnect 126 is laterally offset from the post 122 and contact pad 136 (for reasons described in further detail below), an electrical connector 138 is provided to electrically couple the contact pad 136 with the vertical interconnect 126. In the illustrated embodiment, for example, the electrical connector 138 is formed as a conductive layer having a horizontal portion 138a that overlies a portion of the dielectric layer 120, and vertical portion 138b that extends up a sidewall of the via hole 123 in the dielectric layer 120. The electrical connector 138 may be made of any suitable electrically conductive material which may be formed on the electrical device in any suitable manner. For example, the electrical connector 138 may include the same material(s) as the contact pad 136 and may be formed simultaneously with the contact pad 136.

The vertical interconnect 126 is made of an electrically conductive material that conducts electricity to an opposing interconnect 226 of the second electronic device 212 (e.g., ROIC in the illustrated embodiment). In the illustrated embodiment, the interconnect 126 is made of copper (Cu), although other suitable materials such as nickel or indium could be employed. In exemplary embodiments, the interconnect 126 preferably may be made of a material that does not require high processing temperatures that would destroy the integrity of materials in the device, such as the temperature-sensitive MCT, for example. As shown, the interconnect 126 is formed in a via hole 127 in the bonding layer 124, which may be accomplished in any suitable manner. An interconnect made of copper, for example, will have CTE of about 16.65×10$^{-6}$/K.

In exemplary embodiments, the bonding layer 124 is a conformal dielectric film with a planar surface. The bonding layer 124 provides bonding with an opposing bonding layer 224 of the second electrical device 212. The bonding may include ambient room temperature bonding by Van der Waals forces between the bonding layers 124, 224, and which may be further promoted by covalent fusion bonding at elevated temperatures. The bonding layer 124 may be a non-metallic material, such as an oxide, more particularly a silicon oxide ($SiO_x$), for example silicon dioxide (e.g., fused silica or $SiO_2$). The bonding layer 124 may be formed by any suitable technique, such as a deposition process, including physical vapor deposition, reactive physical vapor deposition, chemical vapor deposition, plasma enhanced chemical vapor deposition, sputtering, or a spin-on glass process. By way of example, and not limitation, the bonding layer 124 made of $SiO_x$ will have a CTE of about $1.5 \times 10^{-6}$/K.

Because of the CTE mismatch between the vertical interconnect 126 (e.g., copper) and its surrounding bonding layer 124 (e.g., $SiO_x$), tensile stresses will develop at the opposite ends of the vertical interconnect structure 124 during cool down in fabrication (e.g., about 150° C. to about 25° C.) or in operation (e.g., about 25° C. to about −200° C.). These tensile stresses can exceed 300 MPa, which can have a detrimental impact on fragile materials in the electrical device 112. For example, the MCT material of the photo-conductive layer 128 is a fragile material, having a low fracture toughness of about 0.20 $MPa \cdot m^{1/2}$ $K_{IC}$. However, some fragile materials, like MCT, may have greater strength in compression than in tension. Accordingly, to mitigate detrimental effects to the fragile material during fabrication or operation at high or low temperatures, the exemplary first electrical device 112 containing the fragile material (e.g., MCT) laterally offsets the vertical interconnect 126 from the interfacial contact pad 136, and arranges the dielectric post 122 above the contact pad 136 with a configuration that imparts a non-tensile state (e.g., neutral or compression) to the underlying region of MCT material 128 below the contact pad 136.

In exemplary embodiments, to impart the non-tensile state to the region of the photoconductive layer 128 underlying the post 122, the CTE of the dielectric layer 120 surrounding and constraining the post 122 is configured to be about equal to or greater than the CTE of the post 122. This is, in effect, the opposite of what occurs with the interconnect 126 and bonding layer 124 interaction during cool down and contraction, which may thus provide neutral or compressive stress instead of tension.

The dielectric layer 120 may be formed with any suitable material or combination of materials in any suitable manner to provide the desired interaction with the post 122 for achieving the desired non-tensile state. In addition, the dielectric layer 120 may be provided as a buffer layer underlying the vertical interconnect 126 to thereby absorb the tensile forces imparted by the vertical interconnect 126 for reducing or eliminating transmission of these forces to the underlying MCT photoconductive layer 128. It is understood that the CTE and thickness of the dielectric layer 120 relative to the post 122 and/or interconnect 126 may be selected to achieve the desired forces exerted upon the fragile material (e.g., MCT) in the photoconductive layer 128, or substrate 118 generally.

In exemplary embodiments, the insulating layer 120 is a multi-layered structure including an upper dielectric layer portion 140 and a lower dielectric layer portion 142. As shown, the via hole 123 for the post 122 extends through both layers 140, 142 such that respective portions of the post 122 are surrounded by each of the upper dielectric layer portion 140 and lower dielectric layer portion 142. In this manner, the combined CTEs of the respective dielectric layer portions 140, 142 constitute the overall CTE of the dielectric layer 120 that is tailored relative to the CTE of the post 122 to provide the non-tensile stress state described above. By way of non-limiting example, both of the dielectric layer portions 140 and 142 in the illustrated embodiment are made of aluminum nitride (AlN), having a CTE of about $5 \times 10^{-6}$/K, but which are deposited in different ways to provide additional functionality (described in further detail below). Alternatively or additionally, a layer of aluminum oxide ($Al_2O_3$) may be employed above or below the AlN layer(s), or by itself as the dielectric layer 120. The aluminum oxide layer may have a CTE of about $8 \times 10^{-6}$/K.

In exemplary embodiments, the different layer portions 140, 142 of the dielectric layer 120 may be adapted to provide enhanced buffering effect to the tensile stresses imparted by the interconnect 126. For example, depending on the deposition parameters, the lower dielectric layer 142 (e.g., AlN) may be deposited to have an intrinsic neutral stress, and the upper dielectric layer 140 (e.g., also AlN) may be deposited to have an intrinsic low-tensile stress. These layers in combination can thus facilitate improved buffering against the high tensile stresses (e.g., 300 MPa or greater) generated by the interconnect structure 126 to thereby reduce or eliminate the tensile stress being imparted to the underlying region (e.g., photoconductive layer 128).

The post 122 may be made of any suitable material or combination of materials in any suitable configuration to provide the desired interaction with its surroundings (e.g., dielectric layer 120) for achieving the non-tensile state of the region underlying the post 122 (e.g., the photoconductive layer 128 via the contact pad 136). As indicated above, the non-tensile state may be a neutral state or a compressive stress state. In exemplary embodiments, the post 122 is formed with an intrinsic compressive stress in the material to facilitate compressive forces thereunder. For example, the post 122 may be formed with a compressive $SiO_x$ material. As shown in the illustrated embodiment, the bonding layer 124 overlying the dielectric layer 120 may extend into the via hole 123 to also form the post 122. This is because the compressive $SiO_x$ layer is suitable as a bonding material and also has a CTE (about $1.5 \times 10^{-6}$/K) that is less than the CTE of the AlN dielectric layer (about $5 \times 10^{-6}$/K). As a result, when the exemplary 3D-integrated device 110 is used at low temperatures (e.g., 60K-90K), for example, the differences in CTE between the AlN dielectric layer 120 and $SiO_x$ post 122 will place the MCT photoconductive layer 128 in a slightly compressive stress state, instead of in tension. The intrinsic compressive stress in the $SiO_x$ material of the post 122, which may be modified based on deposition parameters, also may further facilitate a compressive state in the underlying MCT photoconductive layer 128. Moreover, as is apparent in the illustrated embodiment, using the same material for the bonding layer 124 and post 122 improves ease of fabrication because the bonding layer 124 and post 122 may be formed in the same deposition step.

Still referring to FIG. 7, the second electrical device 212, which is a ROIC in the illustrated embodiment, may have some of the same or similar features as the first electrical device 112, including a substrate 218, a dielectric layer 220 and bonding layer 224 supported by the substrate 218, and at least one electrically conductive interconnect 222 in a via hole extending through the dielectric layer 220 and bonding layer 224. The substrate 218 may include the ROIC circuitry and a contact pad 236 or trace layer for receiving electrons from the photodetector 112 via the combined interconnect structure. The bonding layer 224 is the same as the bonding layer 124, such as $SiO_x$, for bonding to the first electrical device 112. The interconnect 226 may be the same as the interconnect 126 for compatibility in forming a single integrated vertical interconnect structure 150.

As shown in the illustrated embodiment, the second electrical device 212 also includes its interconnect 226 offset from a post 222. The post 222 in the illustrated embodiment is formed with the bonding layer material (e.g., SiO$_x$), and the dielectric layer 220 is formed of AlN or other suitable material to provide a CTE that is equal to or greater than the CTE of the post 222. As such, the post 222 also causes compressive forces on its substrate 218. Because the post 222 is opposite the post 122 this may contribute to compressive force being imparted to the substrate 118 of the first electrical device 112. It is understood that the foregoing may be accomplished with only post 122 and not post 222 if the CTEs are engineered to do so.

The 3D-integration of the first electrical device 112 and second electrical device 212 may be accomplished in any suitable manner, such as via conventional 3D-integration techniques. For example, following preparation of each electrical device 112, 212, the bonding layers 124, 224 may be aligned and interfaced together at room temperature (about 25° C.) which may form an initial Van der Waals bond. An elevated temperature anneal of about 150° C. may be performed to promote covalent fusion bonding of the bonding layers 124, 224. At the elevated temperature anneal, the respective interconnects 126, 226 will interface together and fusion bond forming the single integrated interconnect structure 150. This hybrid bonding process thus bonds and electrically integrates the individually stacked electrical devices 112, 212 together to form the exemplary 3D-integrated device 110.

Figure 5B:
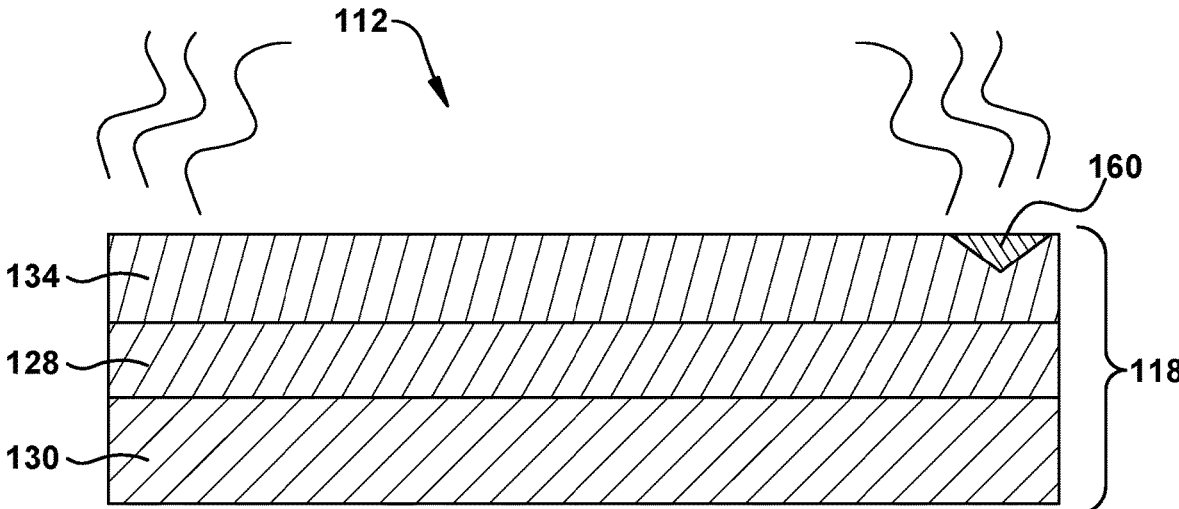
Figures 5C, 5D:
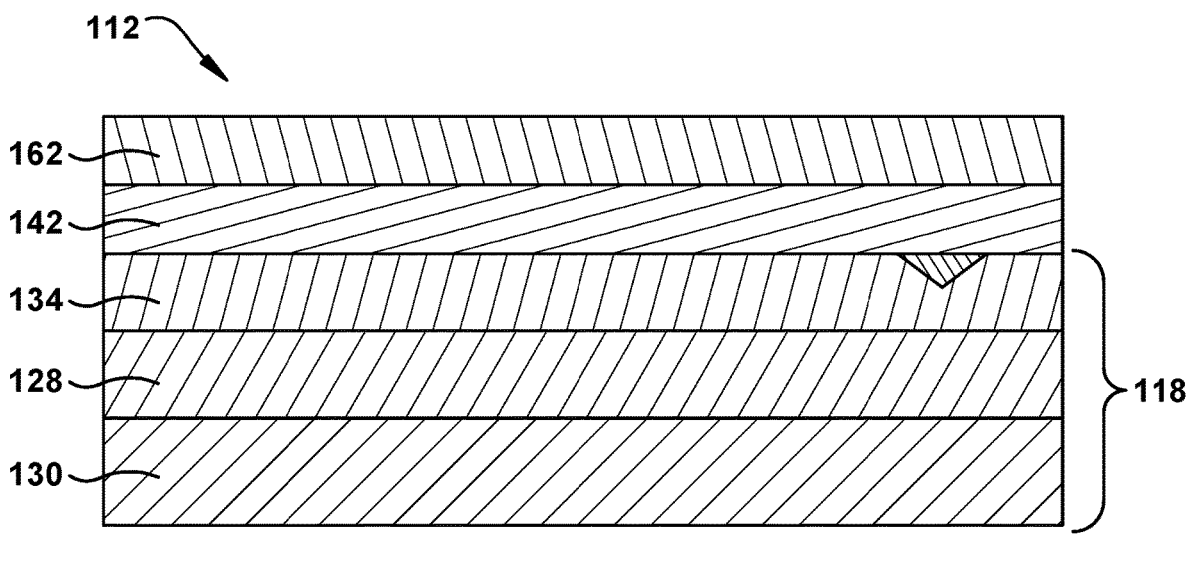
Figure 5E:
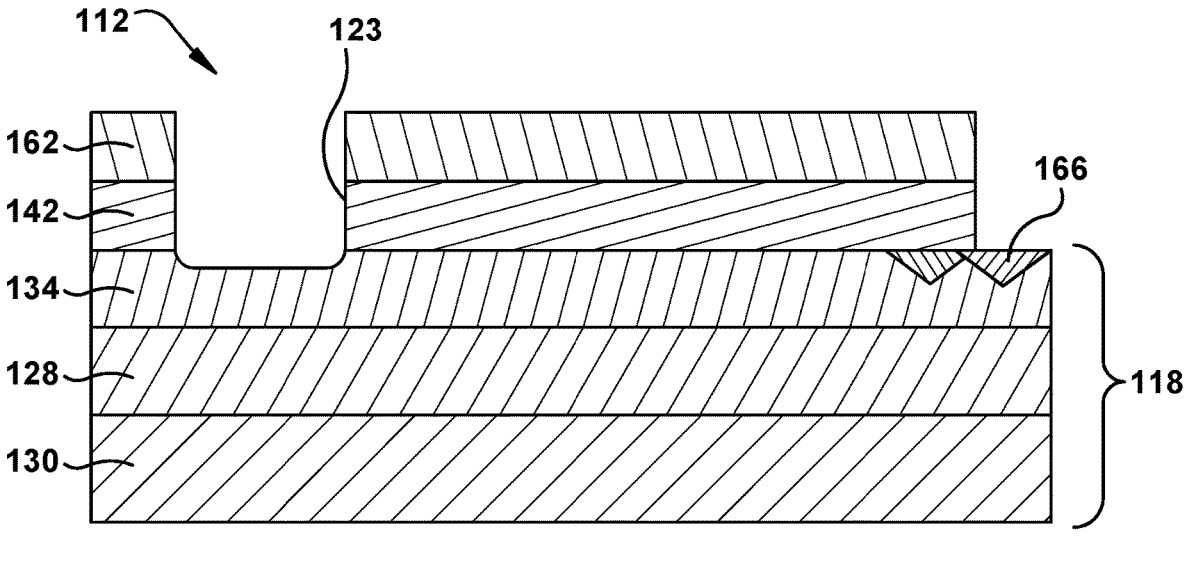
Figure 5F:
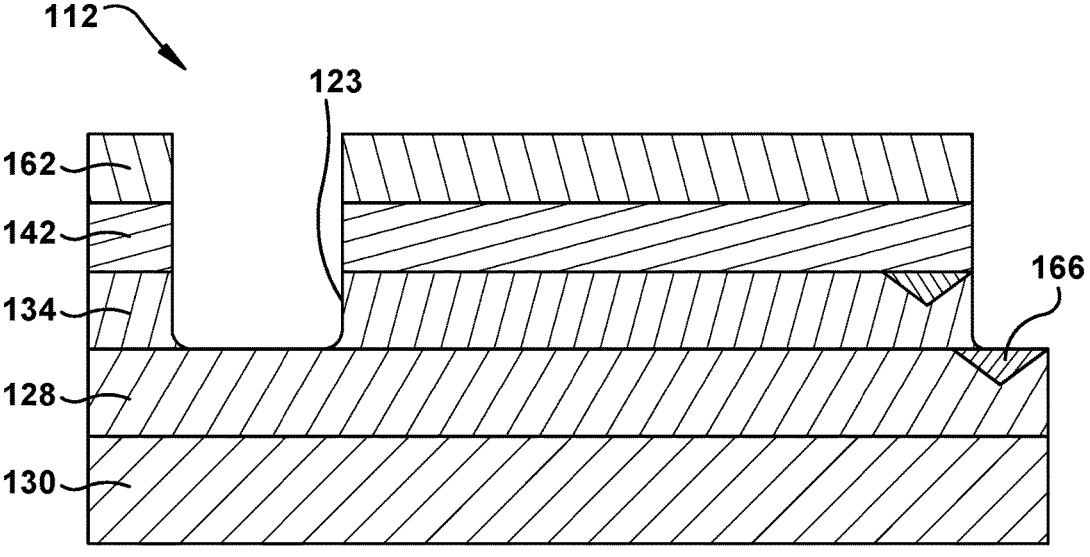
Figure 5G:
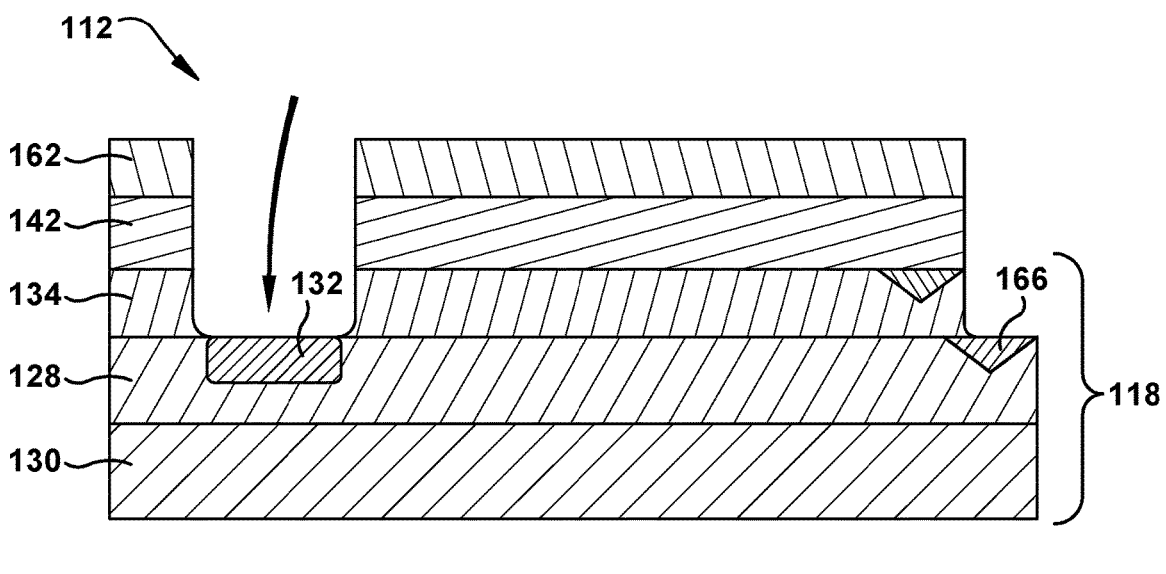
Figure 5H:
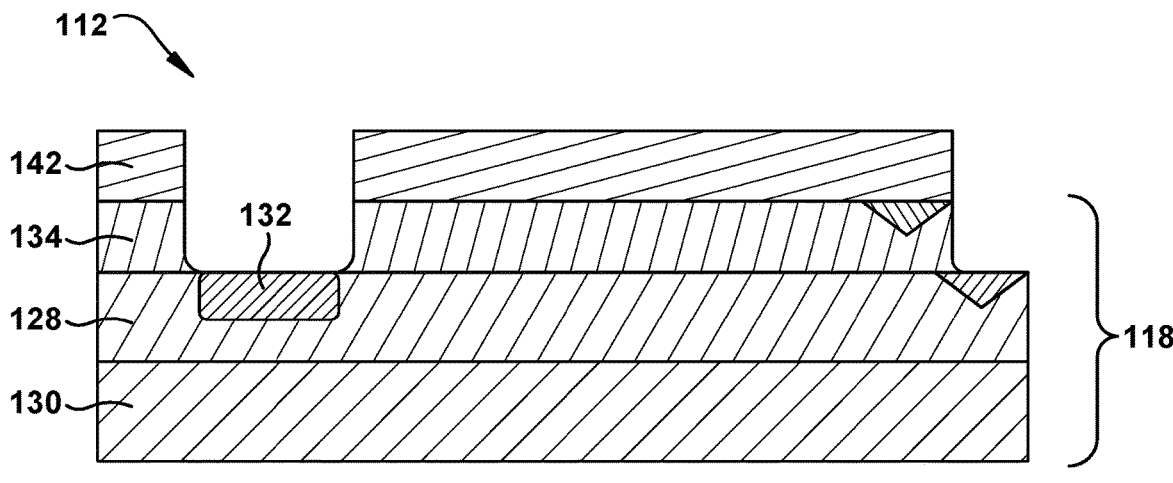
Figure 5I:
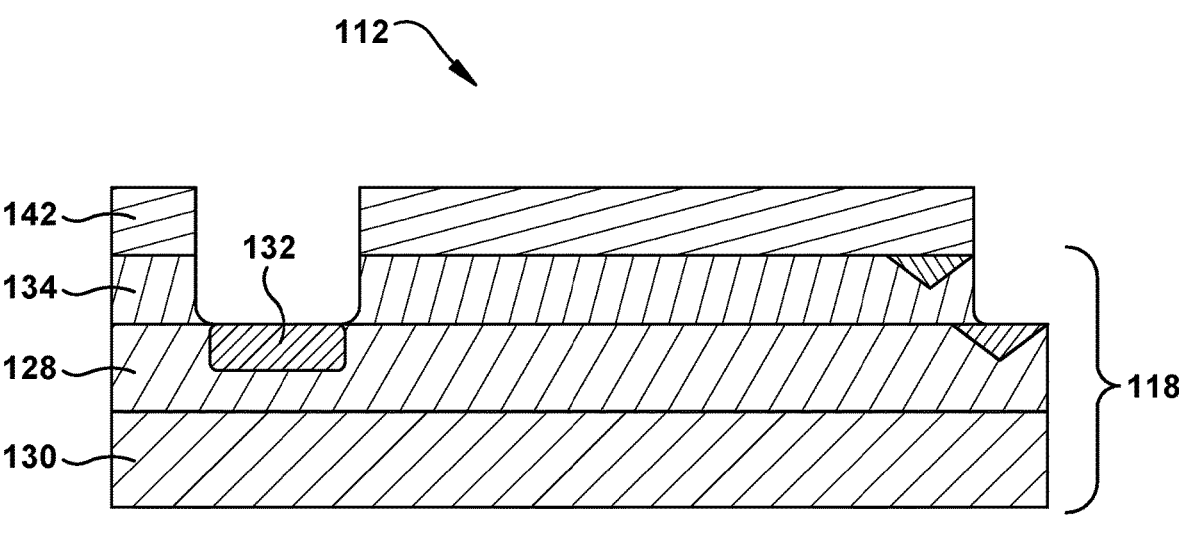
Figure 5J:
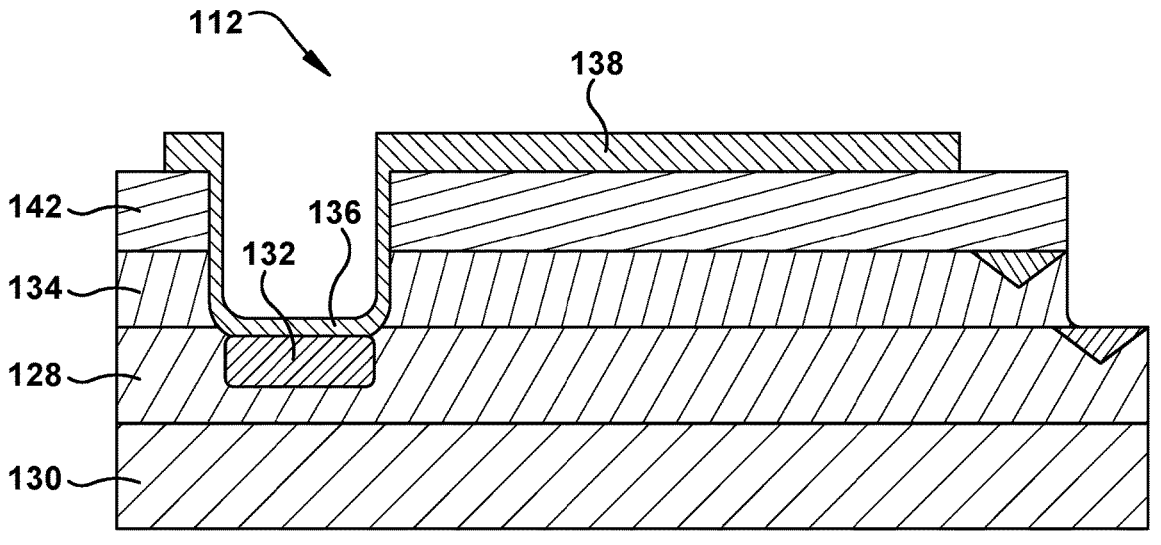
Figure 5K:
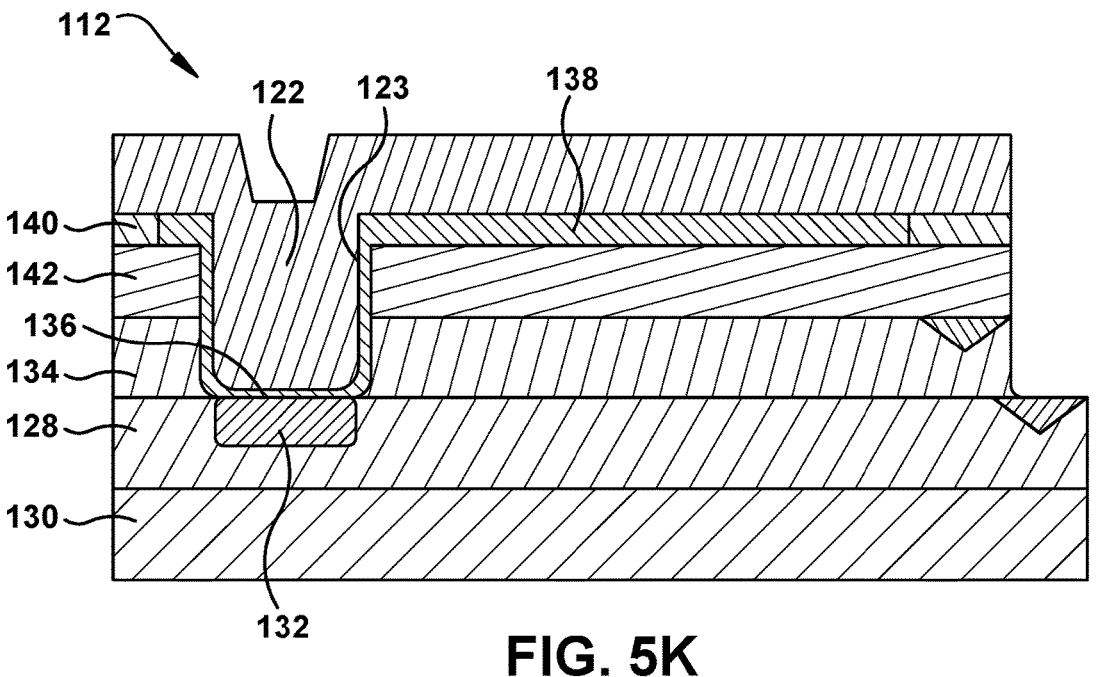
Figure 5L:
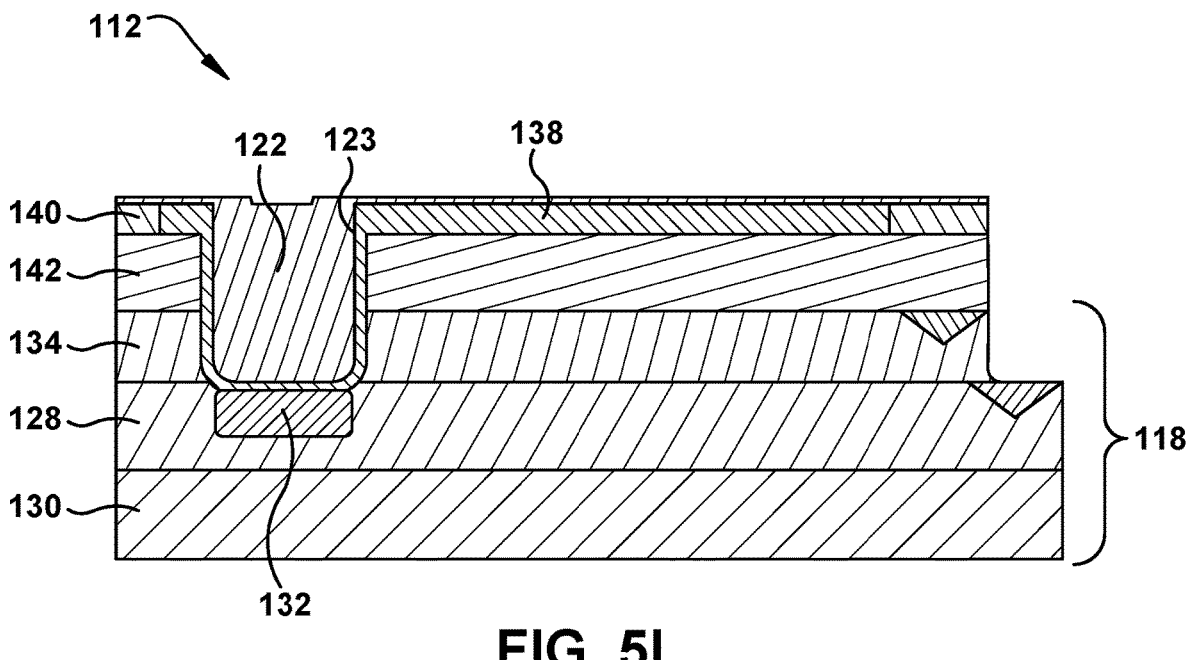
Figure 5M:
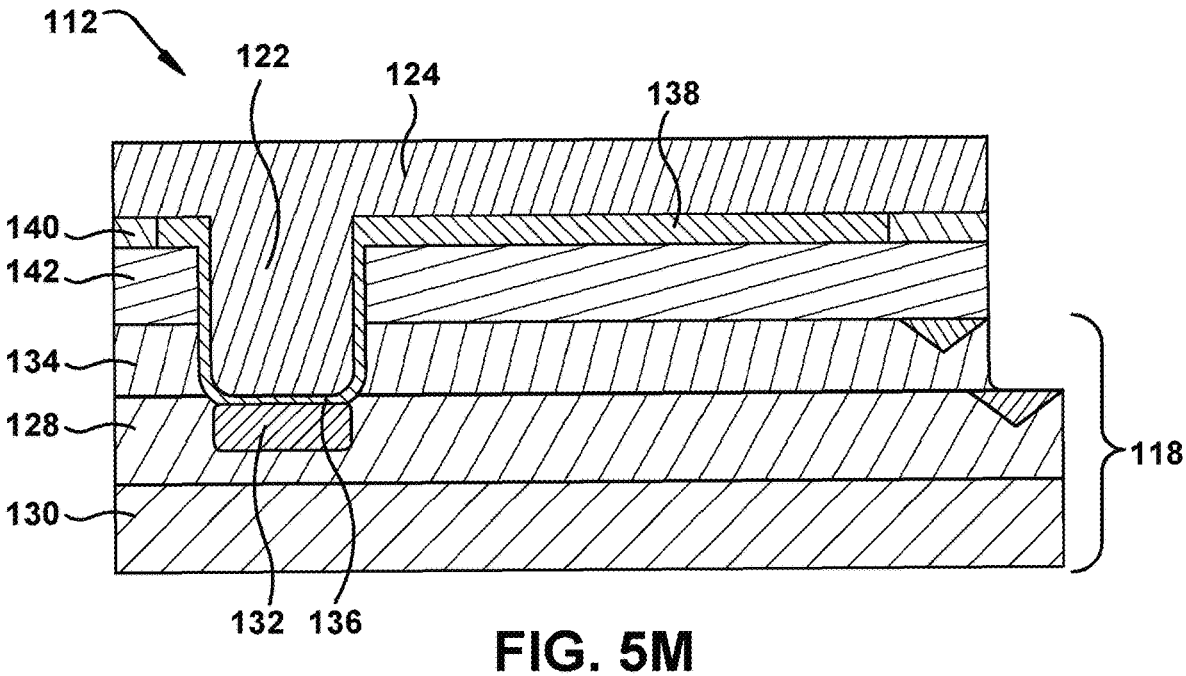
Figure 5N:
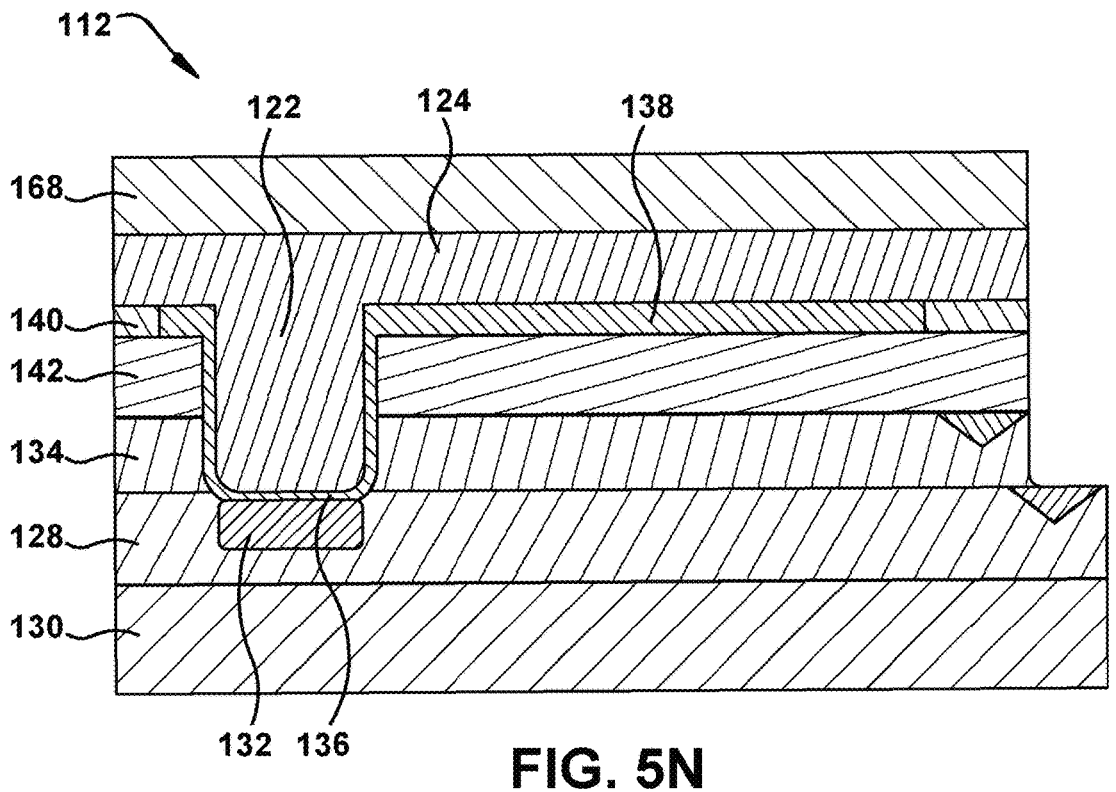
Figure 5O:
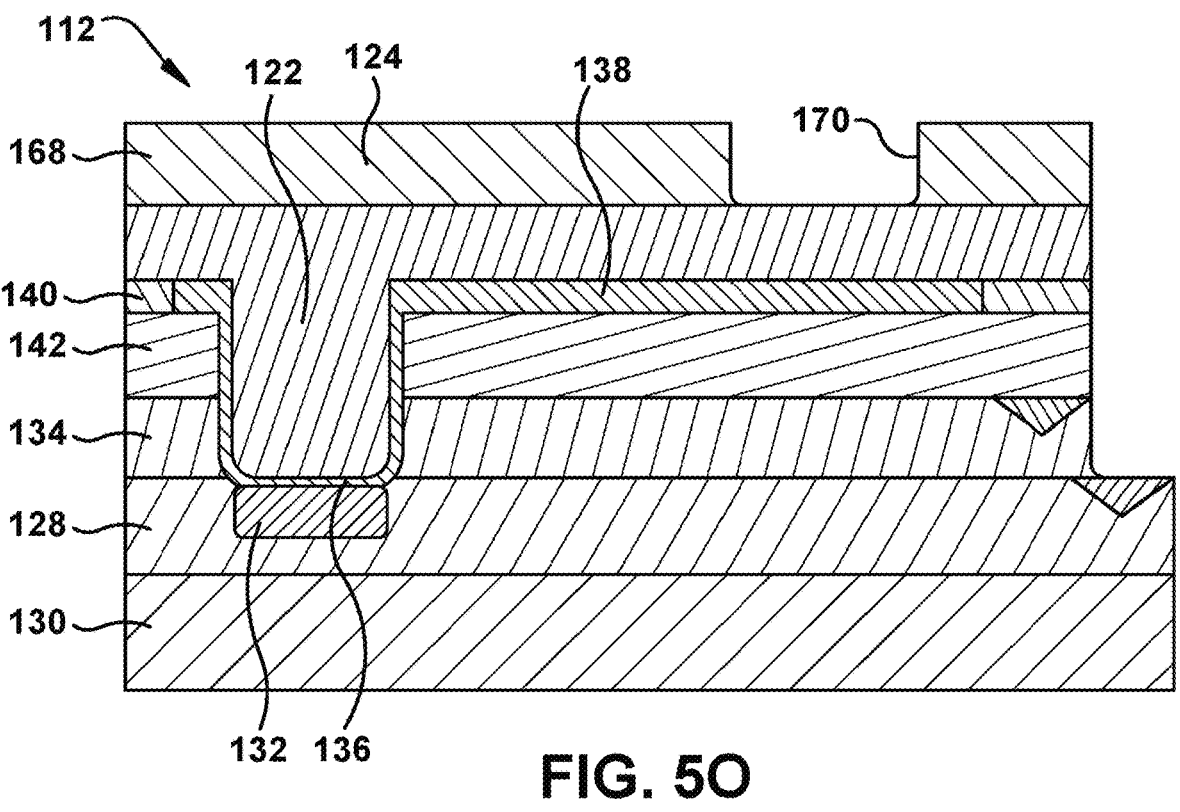
Figure 5P:
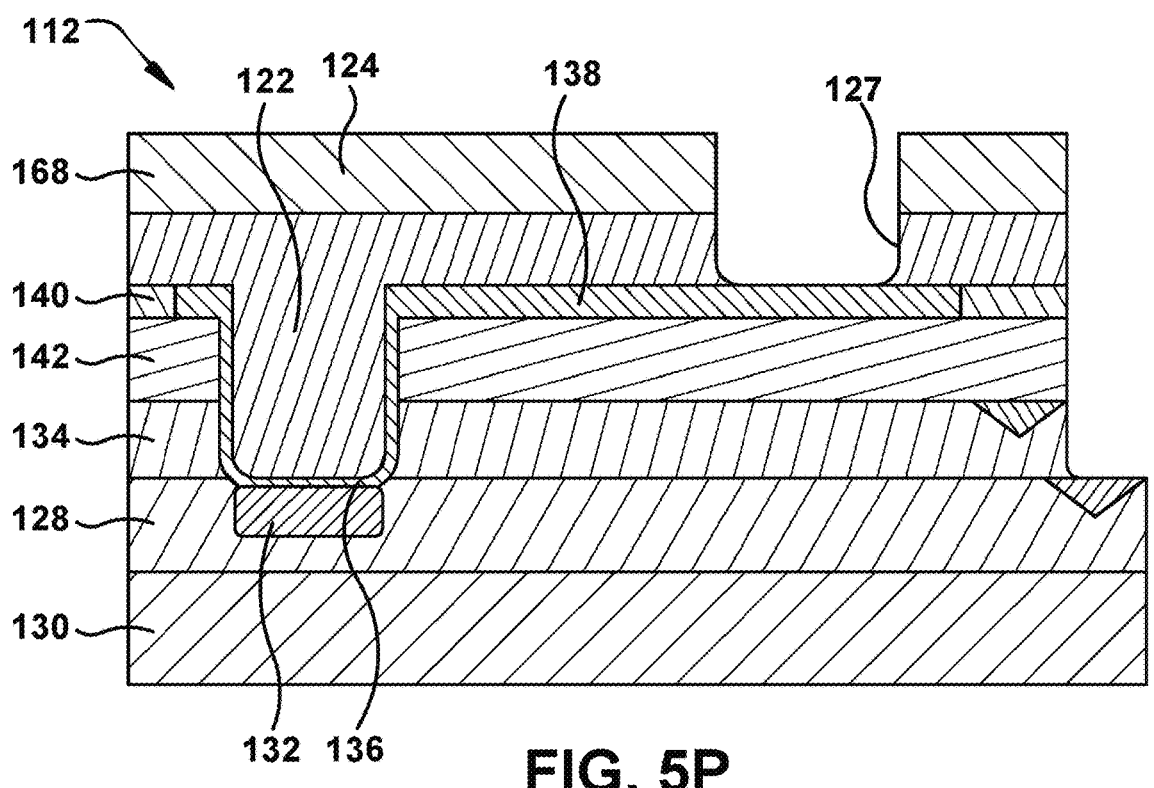
Figure 5Q:
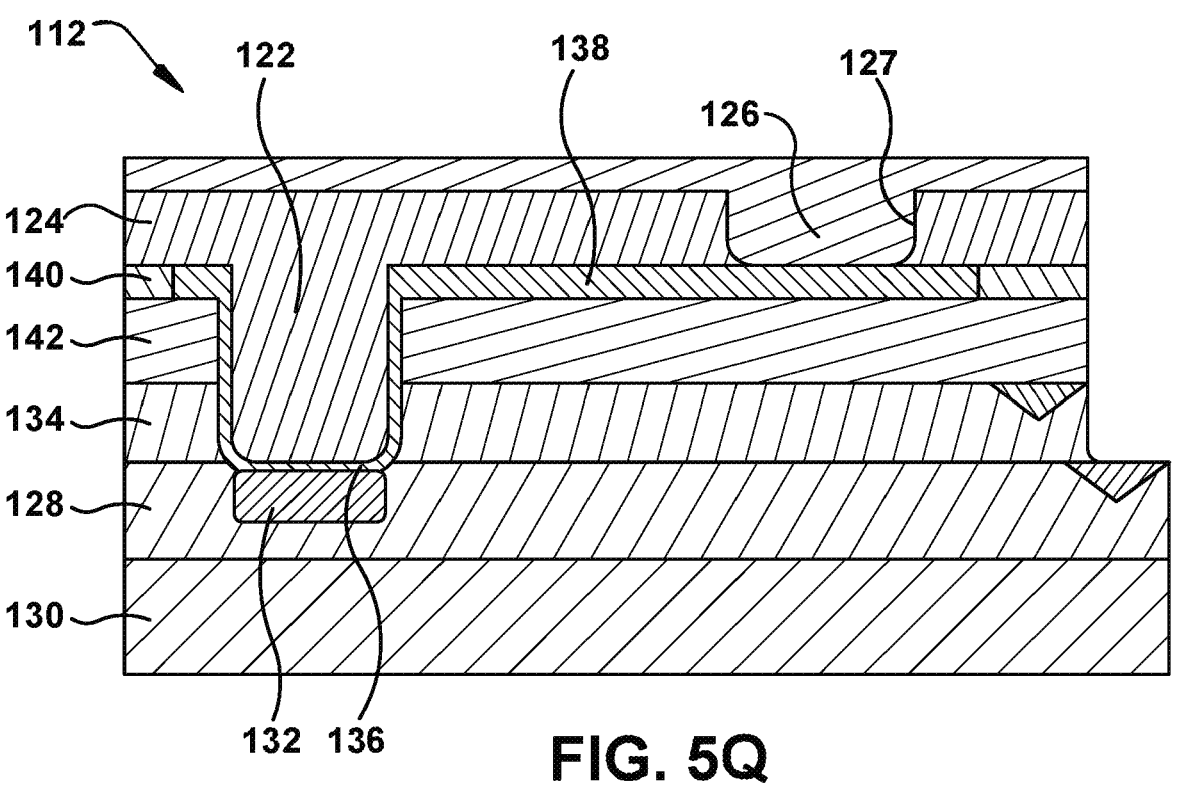
Figure 5R:
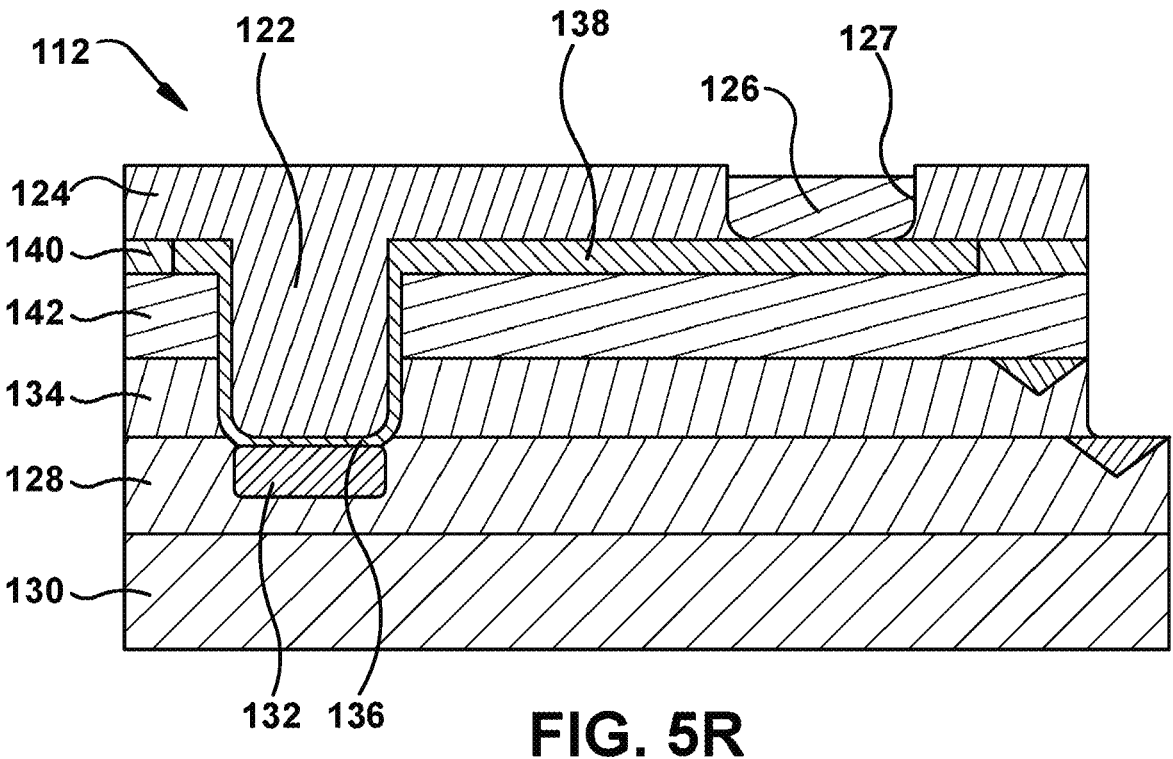

Turning to FIGS. 5A-5R, an exemplary method of fabricating the exemplary electrical device 112 is shown for achieving the exemplary state of the 3D-integrated device 110 shown in FIG. 7.

FIG. 5A shows an initial state in which the substrate 118 is provided, including the lower substrate layer 130 (e.g., silicon), the photoconductive layer 128 (e.g., MCT), and the passivation layer 134 (e.g., CdTe) (note thicknesses not to scale). In the illustrated state, the MCT layer has been epitaxially grown, and the CdTe layer has been deposited in-situ. FIG. 5B shows a process of performing a vacancy fill anneal (squiggle lines) and the etching of a fiducial marker 160 on the passivation layer 134.

FIG. 5C shows deposition of the lower dielectric layer 142 (e.g., AlN) over the passivation layer 134. A photoresist layer 162 is then deposited over the dielectric layer 142. FIG. 5D shows a PE window 164 developed in the photoresist layer 162. A fiducial PE window 166 also is developed in the photoresist layer 162.

FIG. 5E shows dry etching the lower dielectric layer 142 (e.g., AlN) to extend via hole 123 through the lower dielectric layer 142. FIG. 5F shows dry etching the passivation layer 134 (e.g., CdTe) to still further extend the via hole 123. The fiducial marker 166 also follows, as shown.

FIG. 5G shows implanting the implant 132 (e.g., arsenic) in the photoconductor layer 128. FIG. 5H shows stripping the photoresist layer 162.

FIG. 5I shows a process of activating the implant 132 (e.g. arsenic). FIG. 5J shows depositing electrical contact pad 136 and the electrical connector layer 138 (redistribution layer). Thereafter, the redistribution layer is patterned.

FIG. 5K shows deposition of sculpted PVD oxide (e.g., SiOx) which fills the via hole 123 and forms a portion of the post 122. This layer also fills the portions between the patterned redistribution layer 138 and forms a part of post 122. FIG. 5L shows chemical mechanical polishing and removal of an upper portion of the sculpted PVD oxide layer.

FIG. 5M shows deposition of the PVD bonding oxide (bonding layer 124) (e.g., SiOx). FIG. 5N shows deposition of a photoresist layer 168. FIG. 5O shows developing an offset via pattern by forming a window 170 in the photoresist layer. FIG. 5P shows dry etching the bonding layer 124 to form the via hole 127.

FIG. 5Q shows removal of the photoresist layer 168 and electroplating of the interconnect 126 (e.g., indium or copper). FIG. 5R shows chemical mechanical polishing to remove the overburden and expose the bonding layer 124. FIG. 5R shows the electrical device 112 ready for 3D-integration.

Figure 6:
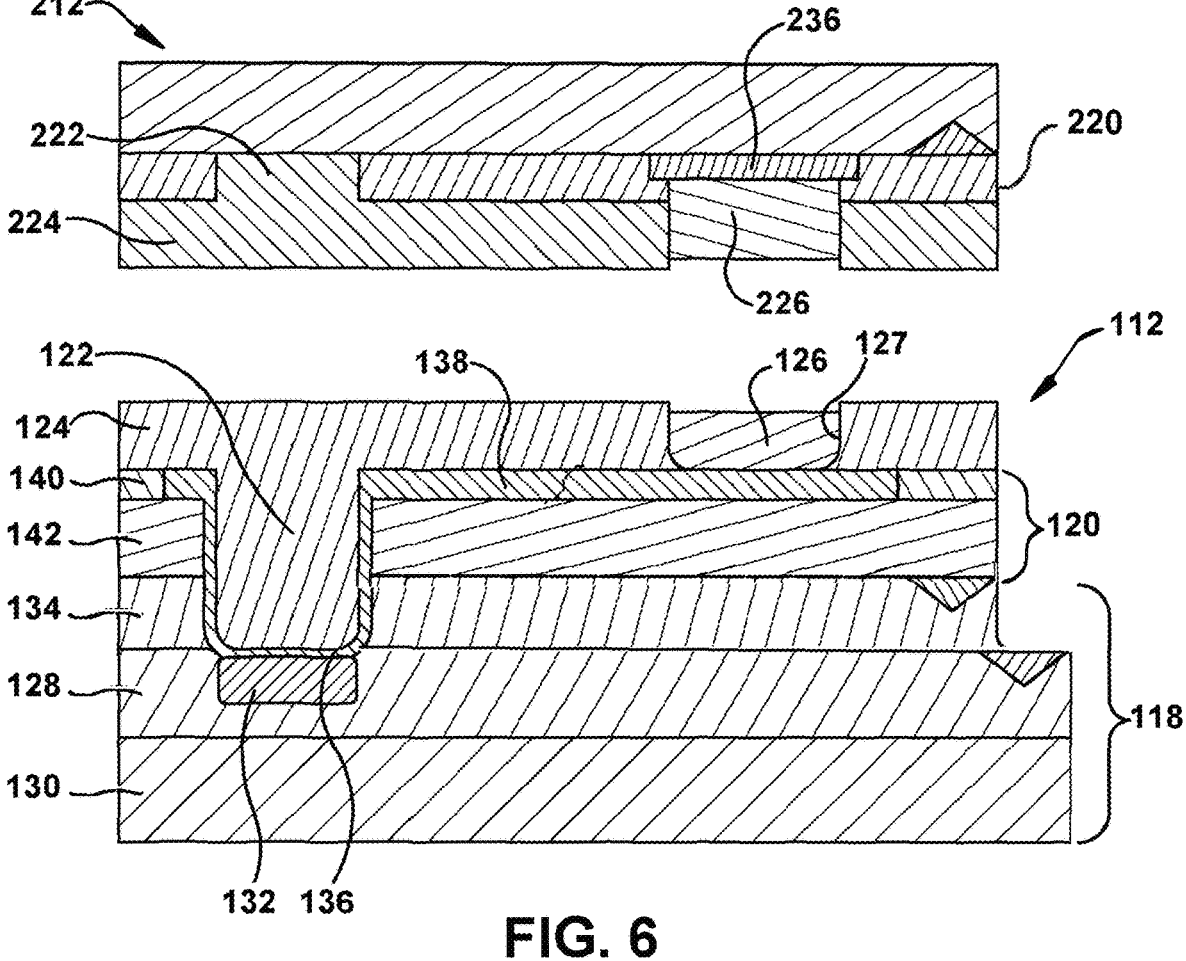
FIG. 6 is a schematic cross-sectional illustration depicting the electrical device in FIG. 5R being aligned with another electrical device in preparation for 3D-integration to result in the 3D-integrated device shown in FIG. 7.

FIG. 6 shows alignment of the first electrical device 112 (e.g., photodector) with the second electrical device 212 (e.g., ROIC) for 3D-integration, as described above.

While an exemplary form of the exemplary electrical device 112 and/or 3D-integrated electrical device 110 has been described above, alternative configurations also could be employed according to the principles and aspects described herein. For example, although reference is made predominantly to MCT as the fragile material, it is understood that other fragile materials may be used at other regions in electrical devices, in which it may be desirable to provide the desired forces by tailoring the structures of the device as described herein. Generally, a fragile material is one having a K$_{IC}$ fracture toughness of less than 1 MPa·m$^{1/2}$.

Generally, an exemplary electrical device has been described herein including a substrate, a dielectric layer supported by the substrate having at least one vertical post disposed within a via hole of the dielectric layer, and at least one electrically conductive vertical interconnect laterally offset from the post. The post is configured to impart a non-tensile state to a region of the electrical device underlying the post. The coefficient of thermal expansion (CTE) of the post may be configured to cooperate with the CTE of the dielectric layer to provide the non-tensile state, such as the dielectric layer having a CTE that is equal to or greater than a CTE of the post. The dielectric layer may have a CTE that is less than the CTE of the electrically conductive vertical interconnect, and may be arranged to provide a buffer to tensile forces imparted by the vertical interconnect.

According to a general aspect of the present disclosure, an electrical device is provided including laterally offset vias with stress buffers and dielectric compression posts.

According to an aspect, an exemplary electrical device is provided with at least two parts that, in combination, provide a neutral state or compression on MCT contacts during cooling. The first part is an offset conductive via located laterally away from the MCT contact pad and connected to it by a film line (a patterned lateral conductor). The second part is a dielectric compression post fabricated from a low-CTE dielectric, positioned directly over the MCT contact pad. During cooling, the compression post contracts less than the surrounding bonding layers to maintain axial compression on the MCT contact pad, while tensile strain from the contracting conductive via is isolated by distance and buffered by dielectric layers.

According to an aspect, a SiO$_x$—filled post over MCT contact pad has a lower CTE than an AlN/SiO$_x$ stack surrounding it, and maintains pressure (compression) on the MCT contact pad as the bonded structure cools to operating temperature, such as 76K.

According to an aspect, the offset conductive interconnect is anchored to an AlN buffer layer, which buffers the underlying MCT substrate from tensile strain.

It is understood that all ranges and ratio limits disclosed in the specification and claims may be combined in any manner. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

The term "essentially of" as used herein in connection with a composition or material, such as "consisting essentially of," or the like, is understood to mean that minor constituent components and/or impurities may be included which do not affect the fundamental function of the composition or material.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The transitional words or phrases, such as "comprising," "including," "carrying," "having," "containing," "involving," "holding," "made of/with," and the like, are to be understood to be open-ended, i.e., to mean including but not limited to, unless otherwise stated.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical device comprising:
    a substrate that includes (i) a lower substrate layer, (ii) a layer of photoconductive material over the lower substrate layer, and (iii) a passivation layer over the layer of photoconductive material;
    a dielectric layer supported by the substrate, wherein the dielectric layer comprises:
        a first dielectric layer portion; and
        a second dielectric layer portion at least partially overlying the first dielectric layer portion;
    a via hole extending through the first dielectric layer portion, the second dielectric layer portion, and the passivation layer;
    an implant within the layer of photoconductive material underlying the via hole, the implant oppositely doped to that of the photoconductive material, wherein a region of the electrical device underlying the implant includes a fragile material that forms at least part of the substrate;
    a vertical post within the via hole;
    an electrical contact pad between the vertical post and the implant; and
    at least one electrically conductive vertical interconnect laterally offset from the vertical post;
    wherein the vertical post is configured to impart a non-tensile state to a region of the electrical device underlying the vertical post.

2. The electrical device according to claim 1, wherein the dielectric layer has a coefficient of thermal expansion that is different than a coefficient of thermal expansion of the vertical post, the dielectric layer at least partially surrounding the vertical post and configured to interact with the vertical post to impart the non-tensile state to the region of the electrical device underlying the vertical post.

3. The electrical device according to claim 1, wherein the dielectric layer has a coefficient of thermal expansion that is equal to or greater than a coefficient of thermal expansion of the vertical post.

4. The electrical device according to claim 1, wherein the dielectric layer has a coefficient of thermal expansion that is less than a coefficient of thermal expansion of the at least one vertical interconnect.

5. The electrical device according to claim 1, wherein the at least one vertical interconnect overlies the dielectric layer and is vertically offset from the vertical post.

6. The electrical device according to claim 1, further comprising a bonding layer, wherein the at least one vertical interconnect is disposed within at least one via hole of the bonding layer, the bonding layer overlying at least a portion of the dielectric layer, and wherein the bonding layer is disposed within the via hole of the dielectric layer to form the vertical post.

7. The electrical device according to claim 1, wherein a bonding layer at least partially overlies the second dielectric layer portion, the first dielectric layer portion is deposited to provide a neutral stress, the second dielectric layer portion is deposited to provide a tensile stress, and the bonding layer is deposited to provide a compressive stress.

8. The electrical device according to claim 7, wherein the first dielectric layer portion is AlN, wherein the second dielectric layer portion is AlN, and wherein the bonding layer is SiO$_x$.

9. The electrical device according to claim 1, wherein the fragile material comprises mercury cadmium telluride.

10. The electrical device according to claim 1, further comprising an electrical connector extending from the electrical contact pad to the at least one vertical interconnect to provide electrical communication therebetween;

wherein the electrical connector includes a conductive layer that overlies a portion of the dielectric layer and extends up a sidewall of the via hole in the dielectric layer.

11. The electrical device according to claim 1, wherein the vertical post imparts a neutral state or a compressive state to the region of the electrical device underlying the vertical post when the electrical device is in an operating state.

12. The electrical device according to claim 1, wherein the fragile material, has a K$_{IC}$ fracture toughness of less than 1 MPa·m$^{1/2}$.

13. The electrical device according to claim 1, wherein the passivation layer comprises cadmium and tellurium.

14. A 3D-integrated electrical device comprising a first electrical device bonded and electrically integrated to a second electrical device, the 3D-integrated electrical device comprising:

a bonding layer;

first and second dielectric layers on opposite sides of respective portions of the bonding layer;

first and second via holes in respective portions of the first and second dielectric layers, the first and second via holes being arranged opposite to each other, wherein the bonding layer is disposed within the first and second via holes to form respective first and second post portions of the 3D-integrated electrical device;

an electrically conductive vertical interconnect extending through the bonding layer, the vertical interconnect being laterally offset from the first and second post portions;

a contact pad underlying at least a portion of the first post portion; and a conductor layer overlying at least a portion of the first dielectric layer to electrically connect the contact pad with a first end portion of the vertical interconnect.

15. The 3D-integrated electrical device according to claim 14, wherein:

the first and second dielectric layers each has a coefficient of thermal expansion that is equal to or greater than a coefficient of thermal expansion of the first and second post portions;

the vertical interconnect has a coefficient of thermal expansion that is greater than the coefficients of thermal expansion of the first and second dielectric layers and greater than a coefficient of thermal expansion of the bonding layer;

at least the first post portion is configured to impart a non-tensile state to a region underlying the contact pad; and at least the first dielectric layer underlies the first end portion of the vertical interconnect to provide a buffer to tensile stress imparted under the first end portion of the vertical interconnect.

16. The 3D-integrated electrical device according to claim 14, wherein:

the first dielectric layer includes a first dielectric layer portion and a second dielectric layer portion at least partially overlying the first dielectric layer portion, the bonding layer at least partially overlying the second dielectric layer portion, and the first dielectric layer portion is deposited to provide a neutral stress, the second dielectric layer portion is deposited to provide a tensile stress, and the bonding layer is deposited to provide a compressive stress.

17. The 3D-integrated electrical device according to claim 16, wherein the first dielectric layer portion is AlN, wherein the second dielectric layer portion is AlN, wherein the bonding layer is SiO$_x$, wherein the first post portion is SiO$_x$, wherein the vertical interconnect is copper, and wherein a region of the electrical device underlying the first post portion includes mercury cadmium telluride.

18. The 3D-integrated electrical device according to claim 14, wherein the first electrical device is a photodetector, and the second electrical device is a read out integrated circuit.

19. The 3D-integrated electrical device according to claim 14, further comprising a substrate that includes a fragile material underlying the contact pad, the fragile material having a K$_{IC}$ fracture toughness of less than 1 MPa·m$^{1/2}$.

20. A method of making an electrical device, comprising:

providing a substrate that includes (i) a lower substrate layer, (ii) a layer of photoconductive material over the lower substrate layer, and (iii) a passivation layer over the layer of photoconductive material, wherein a fragile material forms at least part of the substrate;

forming a dielectric layer overlying at least a portion of the substrate, the dielectric layer comprising:

a first dielectric layer portion; and a second dielectric layer portion at least partially overlying the first dielectric layer portion;

forming a via hole in the dielectric layer extending through the first dielectric layer portion, the second dielectric layer portion, and the passivation layer;

forming an implant within the layer of photoconductive material underlying the via hole, the implant oppositely doped to that of the photoconductive material, wherein a region of the electrical device underlying the implant includes the fragile material that forms at least part of the substrate;

forming a vertical post in the via hole;

forming an electrical contact pad between the vertical post and the implant;

forming an electrically conductive vertical interconnect laterally offset from the vertical post; and forming an electrical connector extending from the electrical contact pad to the vertical interconnect to provide electrical communication therebetween;

wherein the vertical post is configured to impart a non-tensile state to a region of the electrical device underlying the vertical post.

* * * * *